United States Patent
Chen (10) Patent No.: US 10,804,318 B2
(45) Date of Patent: Oct. 13, 2020

(54) DOUBLE-SIDED MICRO LIGHT-EMITTING DIODE DISPLAY

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/240,803

(22) Filed: Jan. 7, 2019

(65) Prior Publication Data
US 2020/0219930 A1    Jul. 9, 2020

(51) Int. Cl.
*H01L 27/15*    (2006.01)
*H01L 33/42*    (2010.01)
*H01L 33/46*    (2010.01)

(52) U.S. Cl.
CPC ............ *H01L 27/156* (2013.01); *H01L 33/42* (2013.01); *H01L 33/46* (2013.01)

(58) Field of Classification Search
CPC combination set(s) only.
See application file for complete search history.

(56) References Cited

U.S. PATENT DOCUMENTS

| 2014/0027709 | A1* | 1/2014 | Higginson | H01L 33/44 257/13 |
| 2018/0364095 | A1* | 12/2018 | Nagaya | G01J 1/0204 |
| 2019/0189602 | A1* | 6/2019 | Wu | H01L 21/6835 |
| 2019/0326486 | A1* | 10/2019 | Ting | H01L 33/54 |

* cited by examiner

*Primary Examiner* — Ratisha Mehta
(74) *Attorney, Agent, or Firm* — CKC & Partners Co., LLC (57) ABSTRACT

A micro light-emitting diode display including a substrate and at least one pixel and a reflective layer is provided. The substrate has at least a portion that is transparent to visible light. The pixel includes an opaque electrode, a micro light-emitting diode, and a filling material. The opaque electrode is present on the substrate. The micro light-emitting diode is present on and in contact with the opaque electrode. A vertical projection of the micro light-emitting diode projected on the substrate at least partially overlaps with a vertical projection of the opaque electrode projected on the substrate. The filling material is present on the micro light-emitting diode and the substrate. The reflective layer is present on the filling material. A vertical projection of the reflective layer projected on the substrate at least partially overlaps with said portion of the substrate.

16 Claims, 8 Drawing Sheets

DOUBLE-SIDED MICRO LIGHT-EMITTING DIODE DISPLAY

BACKGROUND

Field of Invention

The present disclosure relates to a micro light-emitting diode display having a double-sided display function.

Description of Related Art

The statements in this section merely provide background information related to the present disclosure and do not necessarily constitute prior art.

In recent years, micro devices have become popular in various applications. One of the important subfields is micro light-emitting devices. Among all technical aspects of micro light-emitting devices, novel display designs for different kinds of light-emitting paths is one of the promising issues.

SUMMARY

According to some embodiments of the present disclosure, a micro light-emitting diode display including a substrate and at least one pixel and a reflective layer is provided. The substrate has at least a portion that is transparent to visible light. The pixel includes an opaque electrode, a micro light-emitting diode, and a filling material. The opaque electrode is present on the substrate. The micro light-emitting diode is present on and in contact with the opaque electrode. A vertical projection of the micro light-emitting diode projected on the substrate at least partially overlaps with a vertical projection of the opaque electrode projected on the substrate. The filling material is present on the micro light-emitting diode and the substrate. The reflective layer is present on the filling material. A vertical projection of the reflective layer projected on the substrate at least partially overlaps with said portion of the substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1A:
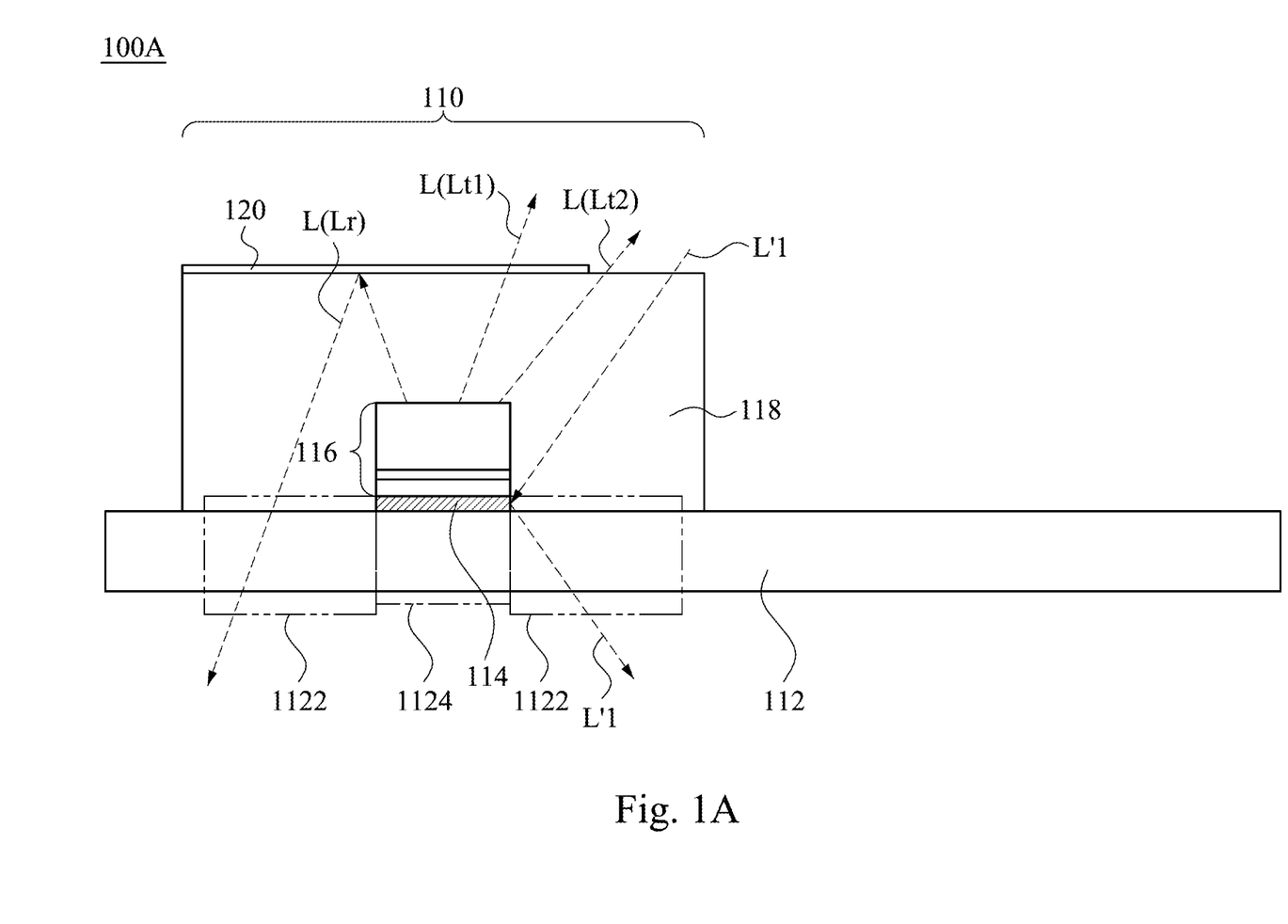
FIG. 1A is a cross-sectional view of a micro light-emitting diode display according to some embodiments of the present disclosure.

Reference is made to FIG. 1A. FIG. 1A is a cross-sectional view of a micro light-emitting diode display 100A according to some embodiments of the present disclosure. In some embodiments, the micro light-emitting diode display 100A includes a substrate 112 and at least one pixel 110 and a reflective layer 120. The substrate 112 has at least a portion 1122 that is transparent to visible light. The pixel 110 includes an opaque electrode 114, a micro light-emitting diode 116, and a filling material 118. The opaque electrode 114 is present on the substrate 112. The micro light-emitting diode 116 is present on and in contact with the opaque electrode 114. A vertical projection of the micro light-emitting diode 116 projected on the substrate 112 is at least partially overlaps with a vertical projection of the opaque electrode 114 projected on the substrate 112. Therefore, no light L'1 incident from outside of the pixel 110 through the reflective layer 120 can pass through the pixel 110 via a part 1124 of the substrate 112 which is underneath the opaque electrode 114. In some embodiments, the micro light-emitting diode 116 includes a first type semiconductor layer, a second type semiconductor layer, and an active layer. The first type semiconductor layer is present on the opaque electrode 114. The second type semiconductor layer is joined with the first type semiconductor layer through the active layer. The opaque electrode 114 is necessary to be opaque for bonding between the micro light-emitting diode 116 and the opaque electrode 114. The micro light-emitting diode 116 can be a vertical type (as shown in FIG. 1A) light-emitting diode or a flip chip light-emitting diode. The filling material 118 is present on the micro light-emitting diode 116 and the substrate 112. The filling material 118 may include a photoresist or resin, but should not be limited thereto. In some embodiments, the filling material 118 is in contact with the micro light-emitting diode 116 and the substrate 112. In some embodiments, the filling material 118 is in contact with the opaque electrode 114. The reflective layer 120 is present on the filling material 118. The reflective layer 120 can be a metal layer, such as a silver (Ag) layer, a gold (Au) layer, a silver gold alloy (AgAu) layer, an aluminum (Al) layer, a platinum (Pt) layer, or the like, but should not be limited thereto. In some embodiments, a reflectivity of the reflective layer 120 is greater than or equal to about 10%, such as between about 30% and about 80%. In some embodiments, the reflective layer 120 includes a dielectric material. In some embodiments, a refractive index of said dielectric material is different from a refractive index of the filling material 118. A vertical projection of the reflective layer 120 projected on the substrate 112 at least partially overlaps with said portion 1122 of the substrate 112. In these embodiments, the reflective layer 120 can be regarded as a semi-reflective layer or a semi-transparent layer, so that a part of the light L(Lr) emitted from the micro light-emitting diode 116 may be reflected back by the reflective layer 120 and transmitted through the portions 1122 of the substrate 112 which are transparent to the light L(Lr). Besides, a part of the light L(Lt1) emitted from the micro light-emitting diode 116 may be transmitted upward through the reflective layer 120 with negligible loss and reflectance by the reflective layer 120. As a result, a ratio of a light intensity transmitting outside the pixel 110 through the substrate 112 and a light intensity transmitting outside the pixel 110 through the reflective layer 120 can be customized. In the embodiments as shown in FIG. 1A, the reflective layer 120 partially covers the pixel 110. Specifically, the reflective layer 120 is partial covering and in contact with the filling material 118, and a part of the light L(Lt2) emitted from the micro light-emitting diode 116 are allowed to transmit outside the pixel 110 in an upward direction without passing through the reflective layer 120 shown in FIG. 1A.

Figure 1B:
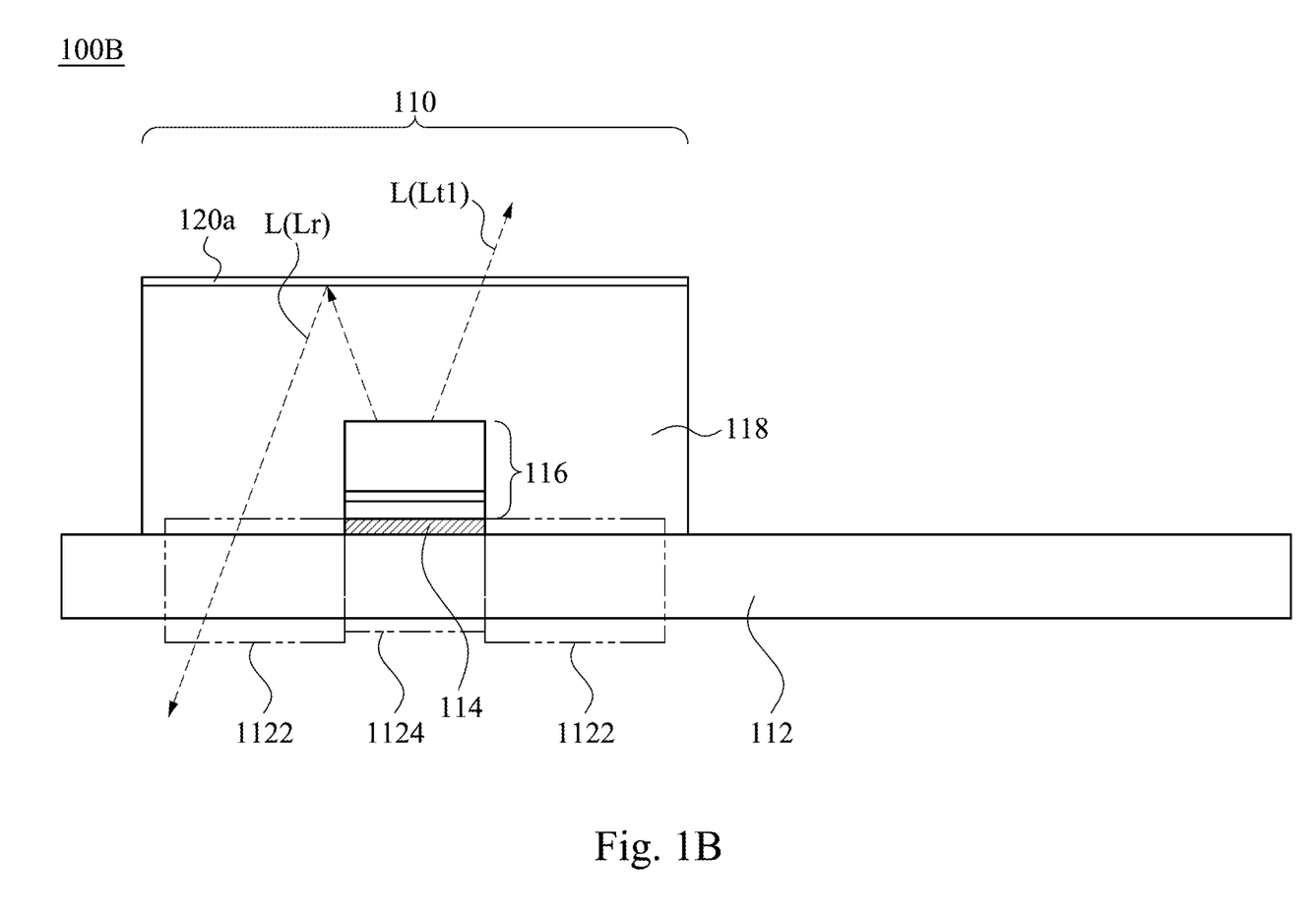
FIG. 1B is a cross-sectional view of a micro light-emitting diode display according to some embodiments of the present disclosure.

Reference is made to FIG. 1B. FIG. 1B is a cross-sectional view of a micro light-emitting diode display 100B according to some embodiments of the present disclosure. A difference between the embodiments as shown in FIG. 1B and the embodiments as shown in FIG. 1A is that the reflective layer 120a fully covers the pixel 110 in the embodiments of FIG. 1B. Specifically, the reflective layer 120a fully covers and in contact with the filling material 118, and the light L(Lt1) emitted from the micro light-emitting diode 116 in the upward direction need to pass through the reflective layer 120a to transmit outside the pixel 110.

Figure 2A:
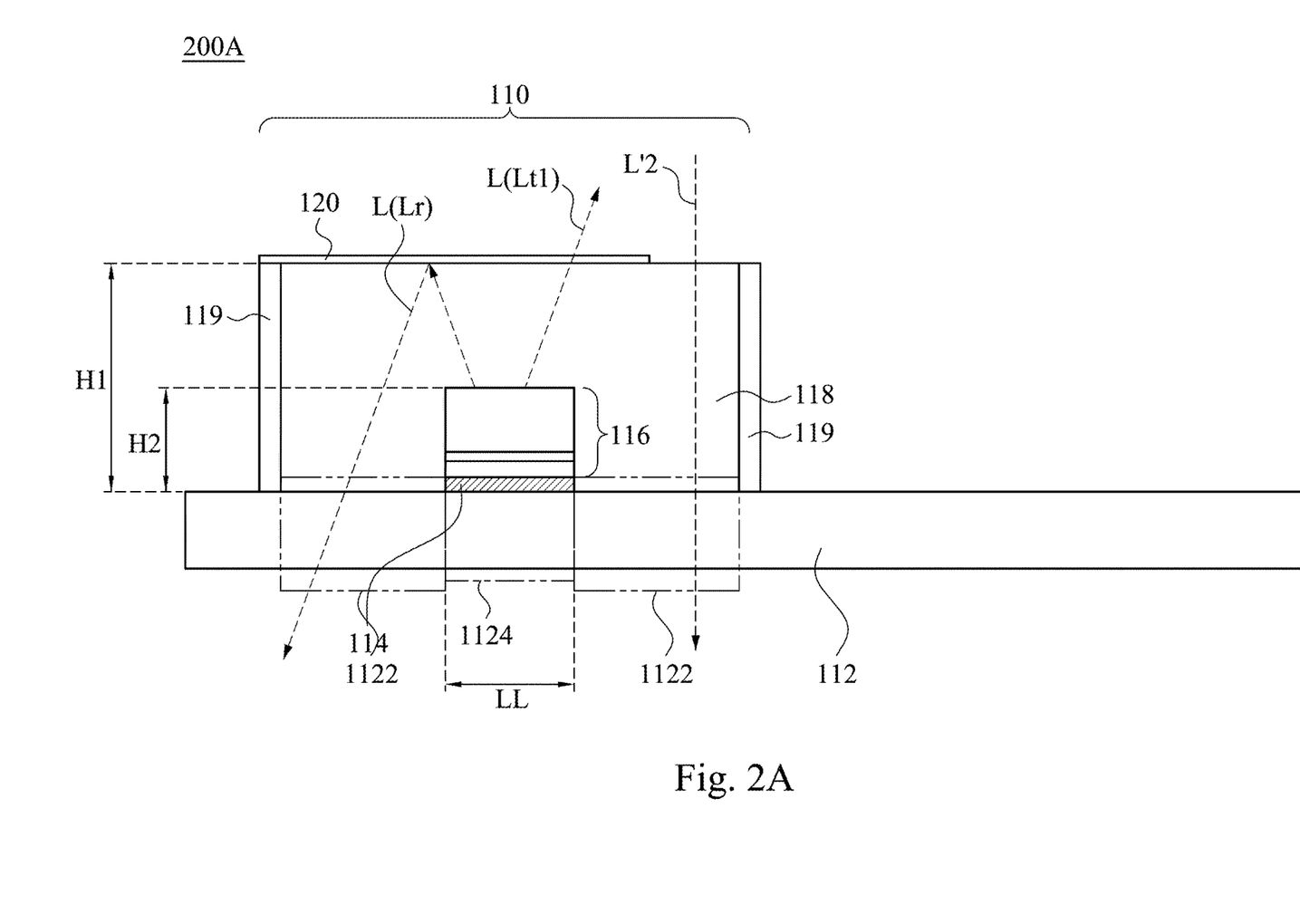
FIG. 2A is a cross-sectional view of a micro light-emitting diode display according to some embodiments of the present disclosure.

Reference is made to FIG. 2A. FIG. 2A is a cross-sectional view of a micro light-emitting diode display 200A according to some embodiments of the present disclosure. A difference between the embodiments as shown in FIG. 2A and the embodiments as shown in FIG. 1A is that the micro light-emitting diode display 200A further includes a sidewall 119 present on the substrate 112 and surrounds the micro light-emitting diode 116 in the embodiments of FIG. 2A. In some embodiments, the reflective layer 120 is present on the sidewall 119. The sidewall 119 can be a light reflective sidewall, a light absorbing sidewall, or a combination thereof. Said combination may be a multi-layer structure including the light reflective sidewall and the light absorbing sidewall. The light reflective sidewall is present on the substrate 112, and the light absorbing sidewall is present on the light reflective sidewall and spaced apart from the substrate 112. A reflectance of the light reflective sidewall is greater than a reflectance of the light absorbing sidewall. In some embodiments, the multi-layer structure includes resin, or photoresist, but should not be limited thereto. In some embodiments, the light reflective sidewall includes tin dioxide ($TiO_2$) particles or/and zirconium dioxide ($ZrO_2$) particles, so as to increase the reflectance of the light reflective sidewall. In some embodiments, a height H1 of the sidewall 119 relative to the substrate 112 is greater than a height H2 of the micro light-emitting diode 116 relative to the substrate 112, so as to better reflect or absorb light emitted from the micro light-emitting diode 116. Individual and combinations of the above conditions for the sidewall 119 reduce interference or cross talk of light L from different pixels 110 and enhance the light extraction (e.g., using said combination of the light reflective sidewall and the light absorbing sidewall) of the micro light-emitting diode 116. Note that in some embodiments, a vertical projection of the reflective layer 120 on the substrate 112 do not overlap with at least a part of the portion 1122 of the substrate 112, so that light L'2 passing through the micro light-emitting diode display 200A which is incident from outside of the pixel 110 through the reflective layer 120 can pass through the whole pixel 110 without significant reflection, so as to realize a transparent pixel (display). In some embodiments, a lateral length LL of the micro light-emitting diode 116 is less than or equal to 50 µm.

Figure 2B:
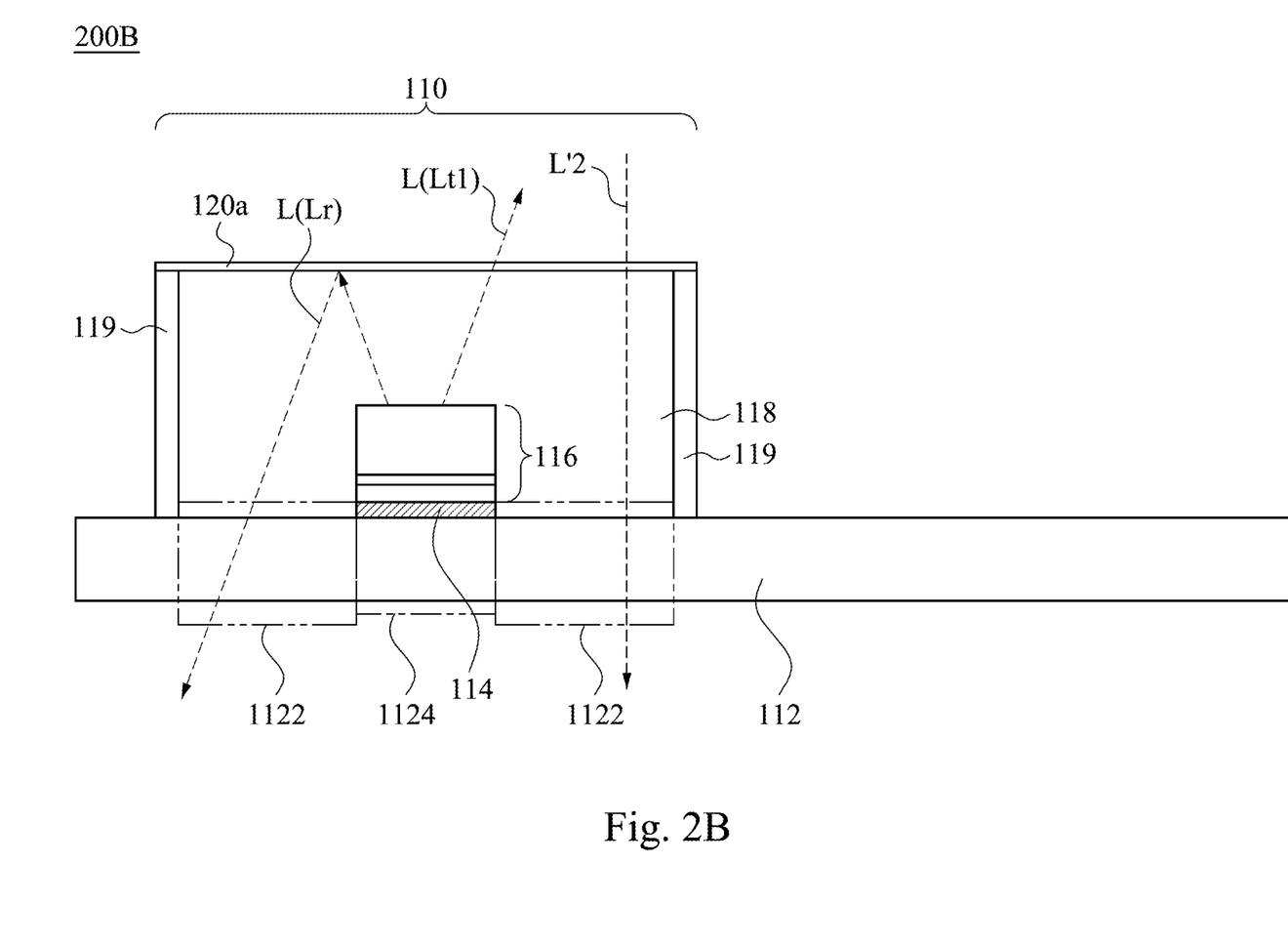
FIG. 2B is a cross-sectional view of a micro light-emitting diode display according to some embodiments of the present disclosure.

Reference is made to FIG. 2B. FIG. 2B is a cross-sectional view of a micro light-emitting diode display 200B according to some embodiments of the present disclosure. A difference between the embodiments as shown in FIG. 2B and embodiments as shown in FIG. 2A is that the reflective layer 120a of the micro light-emitting diode display 200B fully covers the pixel 110 in the embodiments of FIG. 2B. Specifically, the reflective layer 120a fully covers and in contact with the filling material 118, and the light L(Lt1) emitted from the micro light-emitting diode 116 in the upward direction passes through the reflective layer 120a to transmit outside the pixel 110.

Figure 2C:
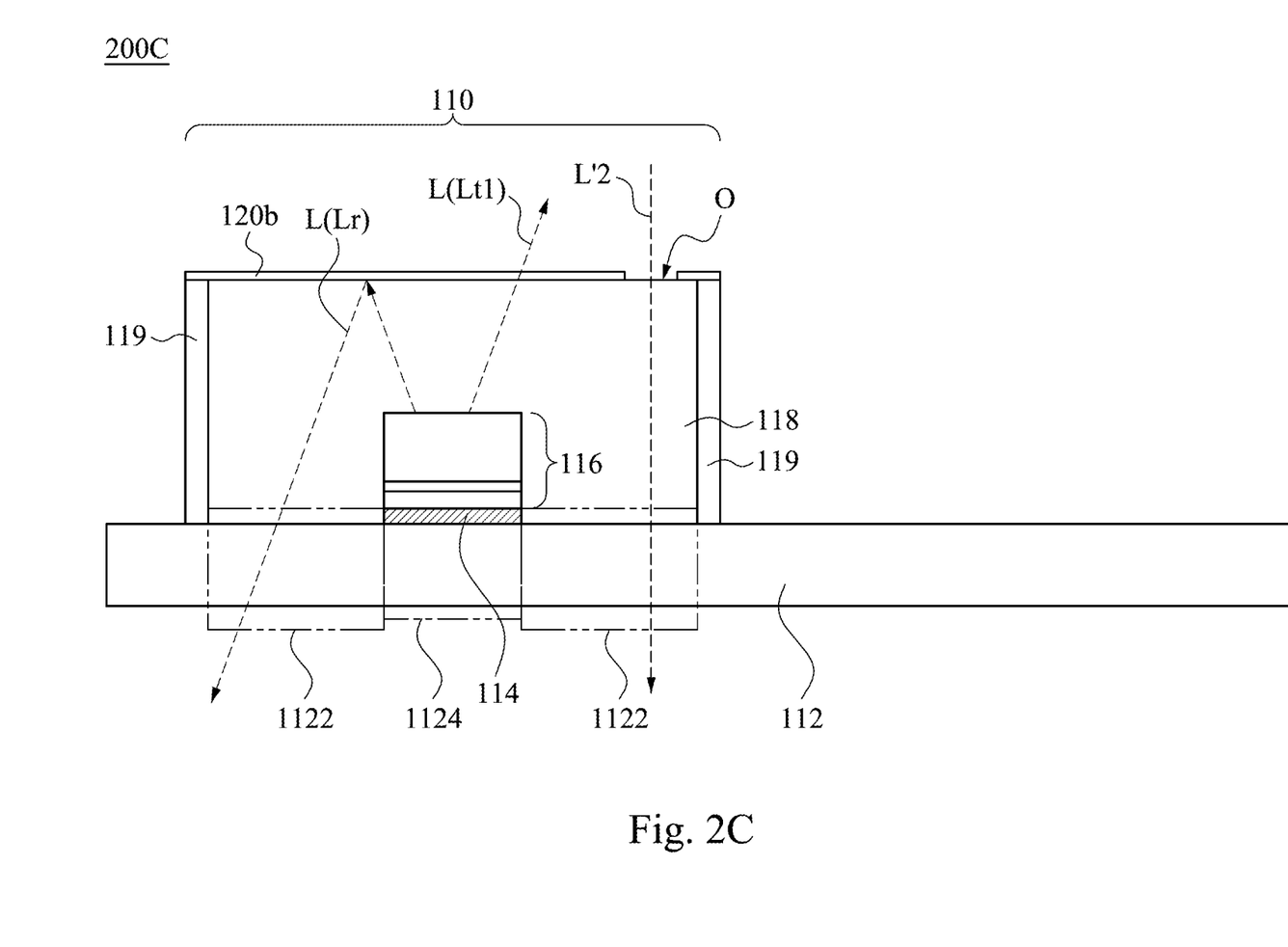
FIG. 2C is a cross-sectional view of a micro light-emitting diode display according to some embodiments of the present disclosure.

Reference is made to FIG. 2C. FIG. 2C is a cross-sectional view of a micro light-emitting diode display 200C according to some embodiments of the present disclosure. A difference between the embodiments as shown in FIG. 2C and embodiments as shown in FIG. 2B is that the reflective layer 120b has one opening O therein in the embodiments of FIG. 2C. In some other embodiments, the reflective layer 120b can have a plurality of openings O therein. Shapes and numbers of openings O can be determined due to practical use for various light extraction designs.

Figure 2D:
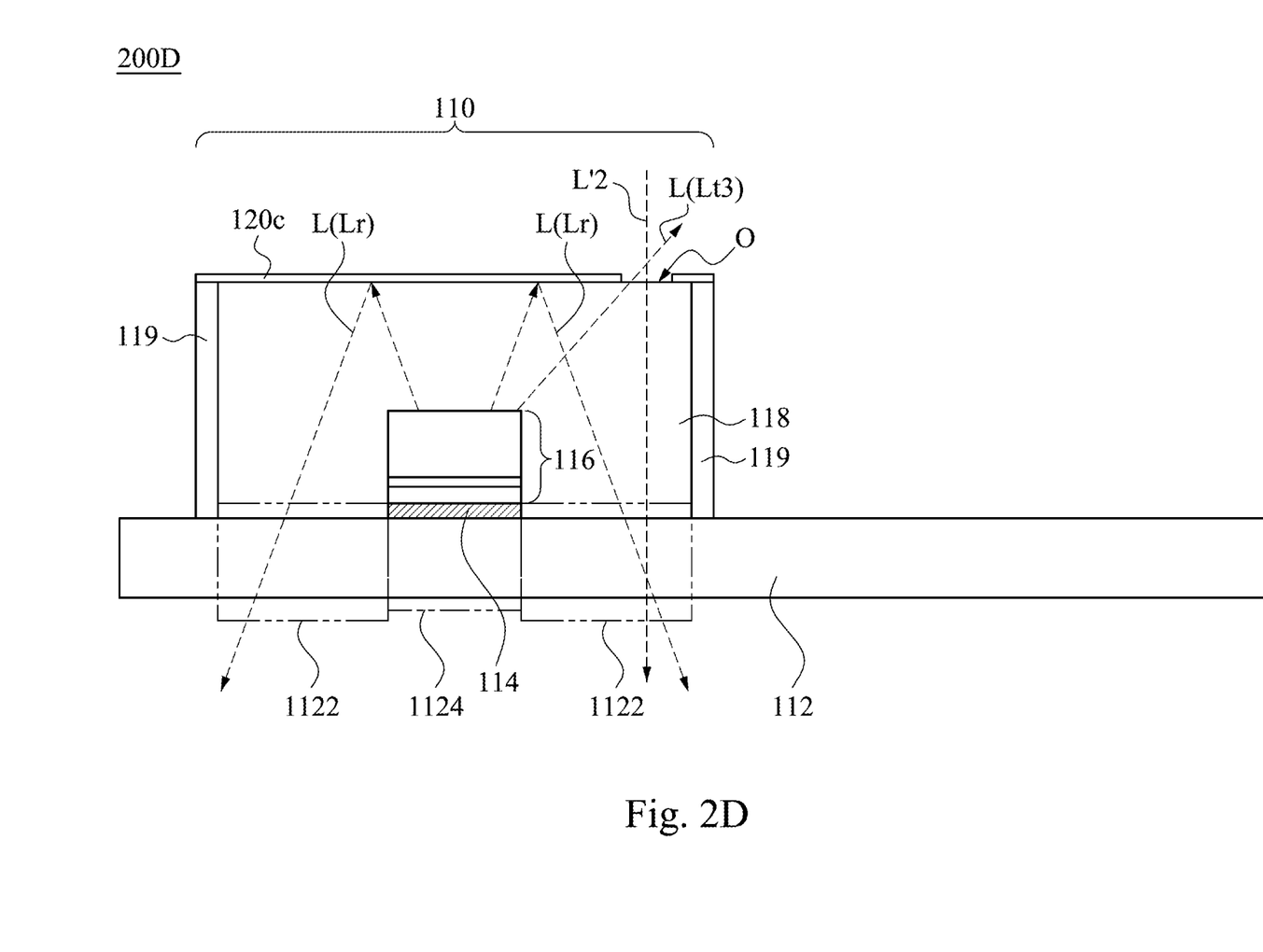
FIG. 2D is a cross-sectional view of a micro light-emitting diode display according to some embodiments of the present disclosure.

Reference is made to FIG. 2D. FIG. 2D is a cross-sectional view of a micro light-emitting diode display 200D according to some embodiments of the present disclosure. A difference between the embodiments as shown in FIG. 2D and embodiments as shown in FIG. 2C is that the reflective layer 120c is a total reflective layer, so that there is absence of the light L(Lt1) emitted from the micro light-emitting diode 116 in the upward direction. Only a part of the light L(Lt3) passing through the opening O is able to transmit outside the pixel 110.

Figure 3:
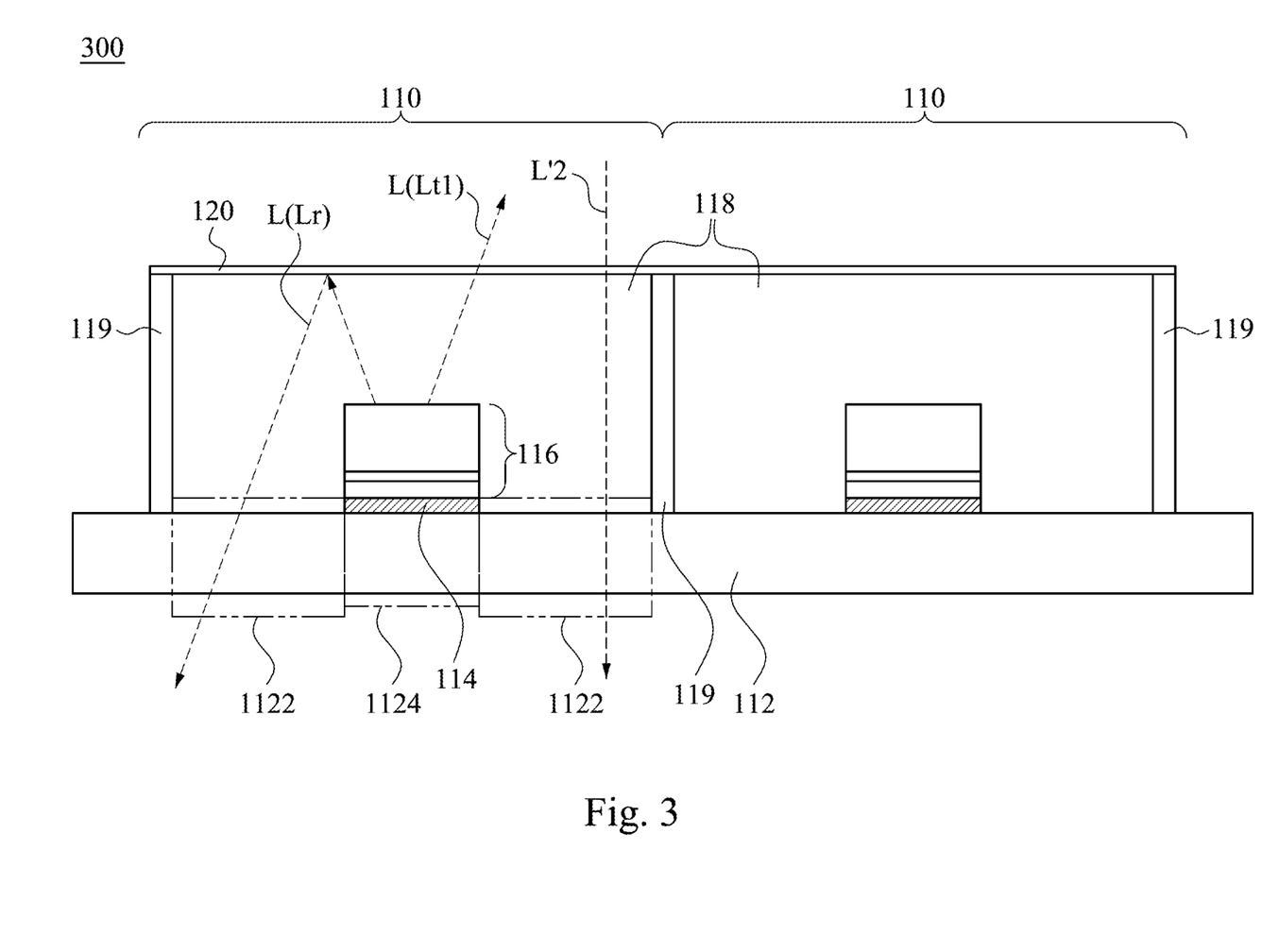
FIG. 3 is a cross-sectional view of a micro light-emitting diode display according to some embodiments of the present disclosure.

Reference is made to FIG. 3. FIG. 3 is a cross-sectional view of a micro light-emitting diode display 300 according to some embodiments of the present disclosure. A difference between the embodiments as shown in FIG. 3 and embodiments as shown in FIG. 2B is that, the micro light-emitting diode display 300 in the embodiments of FIG. 3 further includes one more pixel 110 on the same substrate 112.

Figure 4:
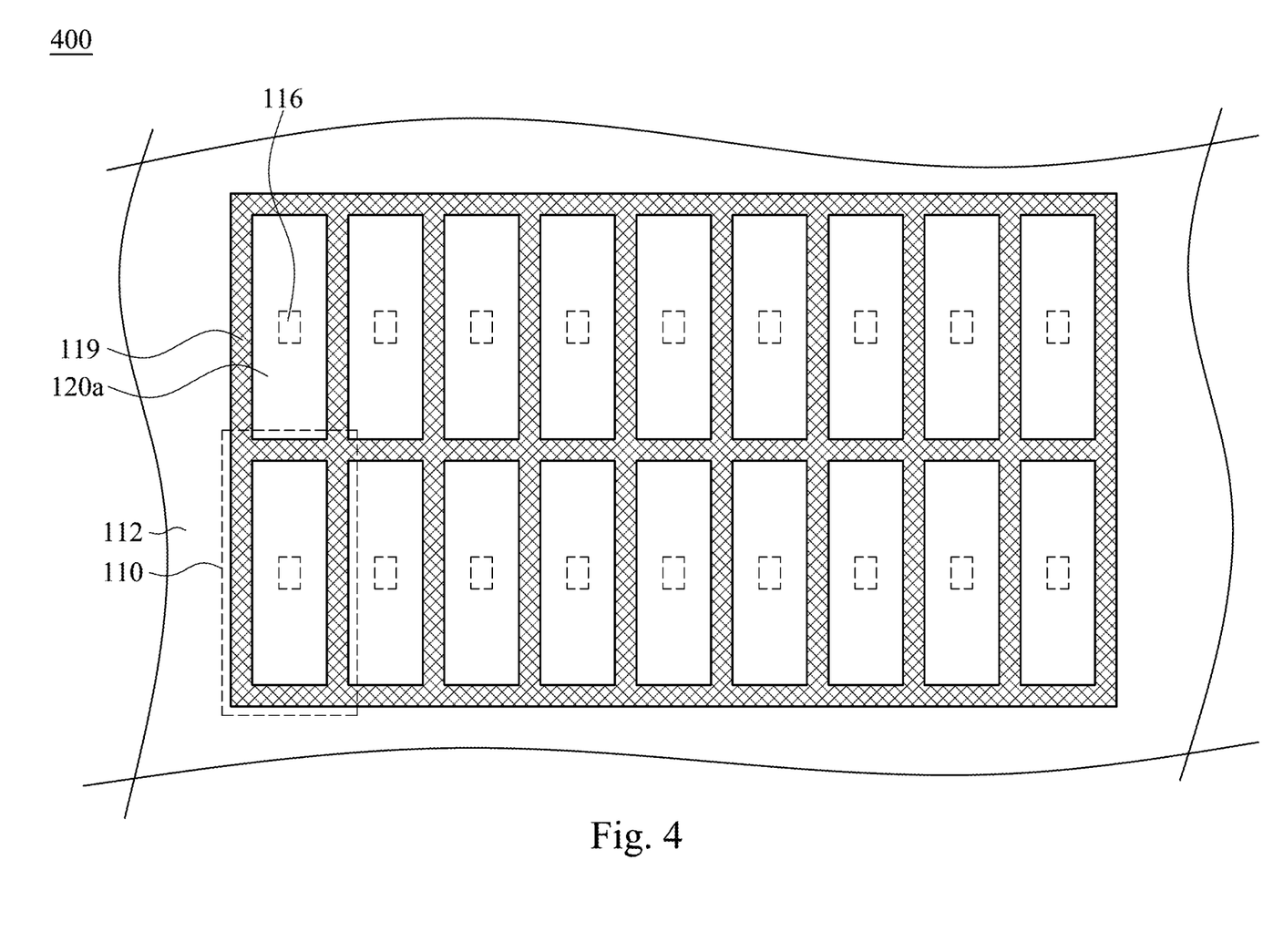
FIG. 4 is a partial top view of a micro light-emitting diode display according to some embodiments of the present disclosure.

Reference is made to FIG. 4. FIG. 4 is a partial top view of a micro light-emitting diode display 400 according to some embodiments of the present disclosure. In some embodiments, there exists more than two pixels 110 on the same substrate 112. In some embodiments, each of the micro light-emitting diodes 116 is fully enclosed by the sidewall 119 and fully covered by the reflective layer 120a as shown in FIG. 4. In some other embodiments, the micro light-emitting diodes 116 can be partially enclosed by the sidewall 119 and partially covered by the reflective layer 120. In still some other embodiments, two or more than two of the micro light-emitting diodes 116 form a set, each of the sets of the micro light-emitting diodes 116 is fully enclosed by the sidewall 119, and the micro light-emitting diodes 116 within at least one of the sets are not separated from each other by the sidewall 119.

In summary, embodiments of the present disclosure provide a micro light-emitting diode display having a double-sided display function. The presence of a reflective layer and a substrate having at least a portion which is transparent can customize the light intensity distributions on two opposite sides of the micro light-emitting diode display.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light-emitting diode display, comprising:
   a substrate having at least a portion that is transparent to visible light;
   at least one pixel comprising:
      an opaque electrode present on the substrate;
      a micro light-emitting diode present on and in contact with the opaque electrode, wherein a vertical projection of the micro light-emitting diode projected on the substrate at least partially overlaps with a vertical projection of the opaque electrode projected on the substrate; and
      a filling material present on the micro light-emitting diode and the substrate; and
   a reflective layer present on the filling material and spaced apart from the micro light-emitting diode, wherein a vertical projection of the reflective layer projected on the substrate at least partially overlaps with said portion of the substrate.

2. The micro light-emitting diode display of claim 1, wherein the reflective layer has at least one opening therein.

3. The micro light-emitting diode display of claim 1, wherein the reflective layer at least partially covers the pixel.

4. The micro light-emitting diode display of claim 1, wherein the reflective layer fully covers the pixel.

5. The micro light-emitting diode display of claim 1, wherein the reflective layer is a metal layer.

6. The micro light-emitting diode display of claim 1, wherein the reflective layer comprises a dielectric material.

7. The micro light-emitting diode display of claim 1, wherein a reflectivity of the reflective layer is greater than or equal to about 10%.

8. The micro light-emitting diode display of claim 1, further comprising a sidewall present on the substrate and surrounding the micro light-emitting diode.

9. The micro light-emitting diode display of claim 8, wherein a height of the sidewall relative to the substrate is greater than a height of the micro light-emitting diode relative to the substrate.

10. The micro light-emitting diode display of claim 8, wherein the sidewall is a light reflective sidewall.

11. The micro light-emitting diode display of claim 8, wherein the sidewall is a light absorbing sidewall.

12. The micro light-emitting diode display of claim 8, wherein the sidewall is a combination of a light reflective sidewall and a light absorbing sidewall.

13. The micro light-emitting diode display of claim 8, wherein the sidewall is a multi-layer structure, and the multi-layer structure comprising:
   a light reflective sidewall present on the substrate; and
   a light absorbing sidewall present on the light reflective sidewall and spaced apart from the substrate.

14. The micro light-emitting diode display of claim 8, wherein the reflective layer is present on the sidewall.

15. The micro light-emitting diode display of claim 1, wherein a vertical projection of the reflective layer on the substrate do not overlap with at least a part of the portion of the substrate.

16. The micro light-emitting diode display of claim 1, wherein a lateral length of the micro light-emitting diode is less than or equal to 50 μm.

* * * * *